(12) United States Patent
Bae (10) Patent No.: US 9,041,012 B2
(45) Date of Patent: May 26, 2015

(54) GALIUM-NITRIDE LIGHT EMITTING DEVICE HAVING A MICROARRAY-TYPE STRUCTURE

(75) Inventor: Sung Bum Bae, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 247 days.

(21) Appl. No.: 13/473,561

(22) Filed: May 16, 2012

(65) Prior Publication Data

US 2012/0292634 A1    Nov. 22, 2012

(30) Foreign Application Priority Data

May 17, 2011    (KR) .......................... 10-2011-0046309

(51) Int. Cl.
*H01L 33/40*    (2010.01)
*H01L 33/38*    (2010.01)
*H01L 33/42*    (2010.01)

(52) U.S. Cl.
CPC .............. *H01L 33/387* (2013.01); *H01L 33/42* (2013.01)

(58) Field of Classification Search
CPC ................................. H01L 33/40; H01L 33/42
USPC ........ 257/76–103, E33.025, E33.064; 436/46
See application file for complete search history.

(56) References Cited

U.S. PATENT DOCUMENTS

2005/0087884 A1* 4/2005 Stokes et al. ................... 257/778
2008/0315229 A1* 12/2008 Yi et al. ........................... 257/98
2009/0184334 A1* 7/2009 Lee et al. ........................ 257/98

FOREIGN PATENT DOCUMENTS

| JP | 2008-171997 A | 7/2008 |
| KR | 10-2004-0008962 | 1/2004 |
| KR | 10-2002-0069357 | 8/2007 |
| KR | 10-0862456 A | 10/2008 |
| KR | 10-2010-0066879 A | 6/2010 |

OTHER PUBLICATIONS

Choi et al., "Efficient GaN-based Micro-LED Arrays", Materials Research Society Proceedings, vol. 743, pp. L6.28.1-L6.28.6, 2002.

* cited by examiner

*Primary Examiner* — Asok K Sarkar
*Assistant Examiner* — Dmitriy Yemelyanov
(74) *Attorney, Agent, or Firm* — Rabin & Berdo, P.C.

(57) ABSTRACT

A microarray-type nitride light emitting device includes a light emitting semiconductor layer; and a multilayered transparent contact layer to divide a plane of the light emitting semiconductor layer into a plurality of microarray-type light emitting regions and a plurality of connect-divided light emitting regions. The multilayered transparent contact layer includes a first transparent contact layer that is composed of a material having a resistance value which is heat determinable, and that divides the plane of the light emitting semiconductor layer into the plurality of microarray-type light emitting regions; a transparent resistor layer that is defined within the first transparent contact layer, that is composed of the material having a resistance value which is heat determinable and has a resistance that is higher than that of the first transparent contact layer; and a second transparent contact layer to connect the plurality of microarray-type light emitting regions.

8 Claims, 7 Drawing Sheets

GALIUM-NITRIDE LIGHT EMITTING DEVICE HAVING A MICROARRAY-TYPE STRUCTURE

CROSS-REFERENCE TO RELATED APPLICATIONS

This application is based on and claims priority from Korean Patent Application No. 10-2011-0046309, filed on May 17, 2011, with the Korean Intellectual Property Office, the disclosure of which is incorporated herein in its entirety by reference.

TECHNICAL FIELD

The present disclosure relates to a microarray type nitride light emitting device and a method of manufacturing the same, and particularly, to a microarray type nitride light emitting device having a uniform current distribution property by dividing a fine light emitting region by using a first transparent contact layer according to a resistance change property in heat treatment of a material of a transparent conducting oxide used as a transparent contact layer, and connecting the divided light emitting regions by using a second transparent contact layer, and a method of manufacturing the same.

BACKGROUND

A gallium nitride (GaN)-based compound semiconductor is a direct transition type semiconductor, and can control a wavelength from visible rays to ultraviolet rays. The gallium nitride-based compound semiconductor has high thermal and chemical stabilities and high electron mobility and saturated electron velocity. The gallium nitride-based compound semiconductor has excellent physical properties such as a large energy band gap as compared to known gallium arsenic (GaAs) and indium phosphorus (InP)-based compound semiconductors. On the basis of the aforementioned properties, an application range thereof is expanded to optical devices such as light emitting diodes (LED) of a visible ray region and laser diodes (LD), and electronic devices used for the next-generation wireless communication and satellite communication systems requiring high power and high frequency properties, which are fields having a limitation in known compound semiconductors.

Light emitting properties of the gallium nitride-based light emitting device depend on an active layer formed of indium gallium nitride (InGaN) or indium aluminum gallium nitride (InAlGaN) and a p-type contact layer to emit light from the active layer to the outside. However, it is difficult to increase internal quantum efficiency due to lattice mismatching between the active layer and the contact layer, and a difference in growth temperature.

Particularly, since an insulating sapphire substrate is used, an electrode structure where n-type and p-type electrodes exist on the same plane is formed, such that a current crowding phenomenon easily occurs. In the case of p-type gallium nitride (GaN), it is difficult to perform a current diffusion due to properties of high thin film resistance and low mobility. This acts as a main factor reducing device properties due to nonuniform light emitting property and heat generation. Accordingly, there is an urgent demand for various device structures and manufacturing processes to manufacture a high-power and large-area light emitting device.

SUMMARY

The present disclosure has been made in an effort to provide a microarray type nitride light emitting device having a uniform current distribution property by dividing a fine light emitting region by using a first transparent contact layer according to a resistance change property in heat treatment of a material of a transparent conducting oxide used as a transparent contact layer, and connecting the divided light emitting regions by using a second transparent contact layer, and a method of manufacturing the same.

An exemplary embodiment of the present disclosure provides a microarray type nitride light emitting device, including: a light emitting semiconductor layer where a buffer layer, an n-type nitride contact layer, an active layer, and a p-type nitride contact layer are sequentially laminated on a substrate; and a multilayered transparent contact layer to divide a plane of the light emitting semiconductor layer into microarray type light emitting regions and connect the divided light emitting regions.

Another exemplary embodiment of the present disclosure provides a method of manufacturing a microarray type nitride light emitting device, including: a light emitting semiconductor layer forming step of forming a light emitting semiconductor layer by sequentially laminating a buffer layer, an n-type nitride contact layer, an active layer, and a p-type nitride contact layer on a substrate; a first contact layer forming step of forming a first transparent contact layer on the formed light emitting semiconductor layer; a light emitting region dividing step of dividing a microarray type light emitting region through heat treatment of the first transparent contact layer through formation of a pattern; and a second contact layer forming step of connecting the divided light emitting regions by a second transparent contact layer.

According to the exemplary embodiments of the present disclosure, there is an effect that a uniform current distribution property is ensured by dividing a fine light emitting region by using a first transparent contact layer according to a resistance change property in heat treatment of a material of a transparent conducting oxide used as a transparent contact layer, and connecting the divided light emitting regions by using a second transparent contact layer.

The present disclosure also has an effect that a problem of reduction in light emitting efficiency is decreased when a large-area light emitting device is manufactured by classifying a transparent contact layer used in the light emitting device into first and second layers through a microarray type light emitting device through partial heat treatment of the transparent contact layer and using the layers in formation and connection of micro light emitting regions to minimize damage to the surface by an etching process and a reduction of an active layer region generating light, and to enable light to be emitted through the transparent resistor layer used when a pattern is formed as compared to a division process between devices through a known etching process, thus manufacturing a large-area light emitting device having high efficiency.

The present disclosure also has an effect that surface planarization can be performed through a subsequent process and various kinds of devices can be integrated together as compared to a method of manufacturing a microarray light emitting device by a known etching process by classifying the micro light emitting regions by using a resistance change property according to heat treatment of the first transparent contact layer.

The present disclosure also has an effect that an injection current can be limited by preventing a current from flowing through a portion other than the micro light emitting regions by using the first transparent contact layer. The present disclosure also has an effect that a current crowding phenomenon, which is considered a problem when a large-area light emitting diode is manufactured can be reduced by allowing the same current to flow through the micro light emitting regions by using the second transparent contact layer. Thereby, there is an effect that a micro light emitting diode having high light emitting efficiency is manufactured in an array form to implement a large-area device and overcome disadvantages of current crowding and reduction of light emitting efficiency when a known large-area device is manufactured, thus improving uniformity of the light emitting device and implementing area enlargement.

The present disclosure also has an effect that in the case where a micro light emitting diode structure is applied to a process of manufacturing a known vertical type light emitting diode, an efficiency reduction factor of reducing in an effective light emitting area according to use of the metal contact layer for current distribution and diffusion can be reduced, thus allowing the implementation of a large-area light emitting device and increase in light emitting efficiency.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments of the present disclosure will be described in detail with reference to the accompanying drawings. The configuration of the present disclosure and operation effect thereof may be apparently understood through the following detailed description. The same reference numerals refer to the same elements throughout the specification even though the same elements are shown in the other drawing, prior to the detailed description of the present disclosure, and known constitutions may not be described in detail if they make the gist of the present disclosure unclear.

The present disclosure relates to a microarray type light emitting device 100 using a III-nitride semiconductor including Group III elements such as gallium (Ga), aluminum (Al), and indium (In) and nitrogen, and a method of manufacturing the same.

Figure 1:
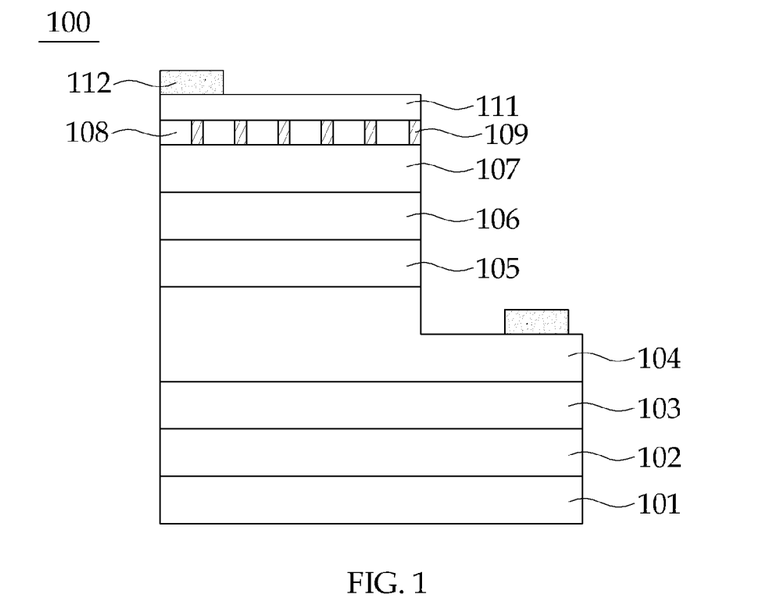
FIG. 1 is a cross-sectional structural view of an exemplary embodiment of a microarray type light emitting device according to the present disclosure.

FIG. 1 is a cross-sectional structural view of an exemplary embodiment of a microarray type light emitting device according to the present disclosure.

As illustrated in FIG. 1, the microarray type light emitting device according to the present disclosure includes a sapphire substrate 101, a low temperature buffer layer 102, a gallium nitride-based support layer 103, an $n^+$-type contact layer 104, an active layer 105, a p-type cladding layer 106, a p-type contact layer 107, a first transparent contact layer 108, a transparent resistor layer 109, a second transparent contact layer 111, and an n-/p-type metal contact layer 112. Herein, the gallium nitride-based support layer 103 is an undoped support layer. The transparent resistor layer 109 performs a function of a light emitting region classification layer.

The light emitting device 100 formed by sequentially laminating the low temperature buffer layer 102, the gallium nitride-based support layer 103, the n-type contact layer 104, the active layer 105, p-type cladding layer 106 and the p-type contact layer 107 on the sapphire substrate 101 includes a transparent contact layer having a multilayered structure. The transparent contact layer having the multilayered structure includes the first transparent contact layer 108 for forming the micro light emitting region and the second transparent contact layer 111 for array connection.

The present disclosure divides the light emitting region through partial formation of a resistor body by using a change in electric conductivity property according to heat treatment of a transparent conducting oxide (TCO) used as transparent contact layer 108. The present disclosure may improve a uniform current distribution and efficiency of the large-area light emitting device through a connection process of the light emitting regions through formation of the second transparent contact layer 111.

FIGS. 2 to 7 are process flow diagrams of an exemplary embodiment of a method of manufacturing a microarray type nitride light emitting device according to the present disclosure.

Figure 2:
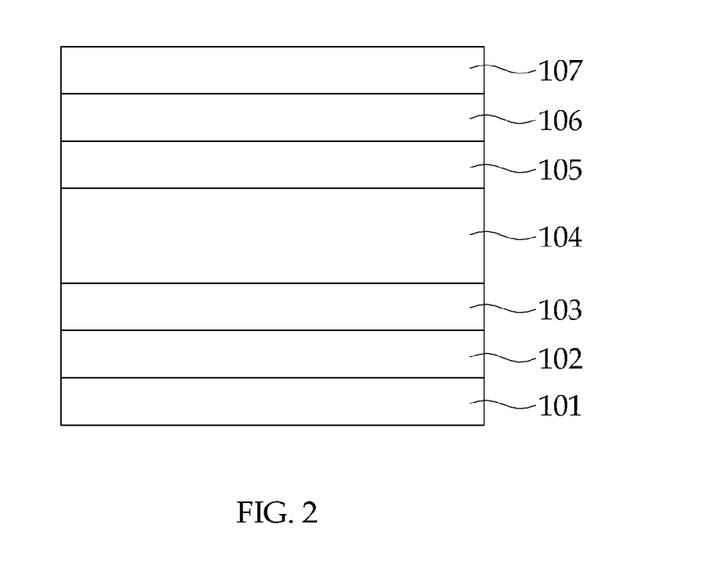
FIGS. 2 to 7 are process flow diagrams of an exemplary embodiment of a method of manufacturing a microarray type nitride light emitting device according to the present disclosure.

FIG. 2 illustrates a light emitting semiconductor layer that is a basic structure of the nitride light emitting device.

Hereinafter, the structure where the sapphire substrate 101, the low temperature buffer layer 102, the gallium nitride-based support layer 103, the $n^+$-type contact layer 104, the active layer 105, the p-type cladding layer 106, and p-type contact layer 107 are sequentially laminated is called a light emitting semiconductor layer.

To be more specific, the manufacturing method grows the low temperature buffer layer 102 on sapphire substrate 101. The manufacturing method grows the undoped gallium nitride (GaN) support layer 103 in a thickness of 2 to 3 μm on low temperature buffer layer 102 in order to improve crystallinity.

The manufacturing method grows the $n^+$-type contact layer 104 on the support layer 103. The $n^+$-type contact layer 104 performs a function of supplying electrons into a multi quantum well (MQW), and a thickness thereof is in the range of 2 to 4 nm.

The manufacturing method grows the active layer 105 having an indium gallium nitride/gallium nitride (InGaN/

GaN) multi quantum well structure determining a light emitting wavelength on n+-type contact layer 104.

The manufacturing method grows the cladding layer 106 that is a p-AlxGa1-xN barrier layer performing a current blocking function. In this case, the range of x that is a compositional ratio of aluminum (Al) is 0.1 to 0.2, and a thickness thereof is in the range of 30 to 1000 Å.

The manufacturing method grows the p-type contact layer 107 on the cladding layer 106. The p-type contact layer 107 is formed of p-gallium nitride (GaN) supplying holes, and a thickness thereof is in the range of 500 to 5000 Å.

Figure 3:
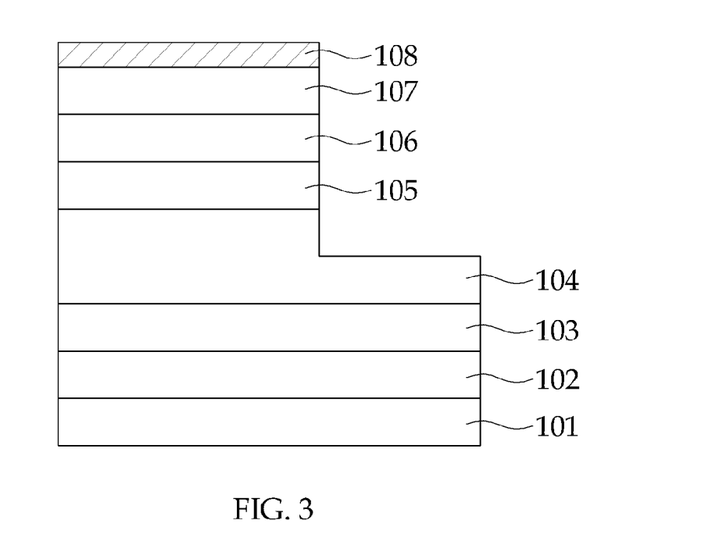

FIG. 3 illustrates a cross-sectional structure of the light emitting device on which the first transparent contact layer 108 is formed.

Referring to FIG. 3, the method of manufacturing the light emitting device performs etching up to the n+-gallium nitride (GaN) contact layer 104 through a first etching process, and laminating the first transparent contact layer 108 on p-type contact layer 107. The first etching process is a dry etching process. In this case, the first transparent contact layer 108 is laminated as an IZO-based transparent conducting oxide having an increase property of a resistance value according to heat treatment.

Herein, as first transparent contact layer 108, an IZO (indium zinc oxide) or ZnO (zinc oxide)-based transparent conducting oxide having a resistance value changed by heat treatment is used. The thickness of the first transparent contact layer 108 may be in the range of 10 to 1,000 nm, and that transmittance be 80% or more within the range of the light emitting wavelength of the active layer 105.

Figure 4:
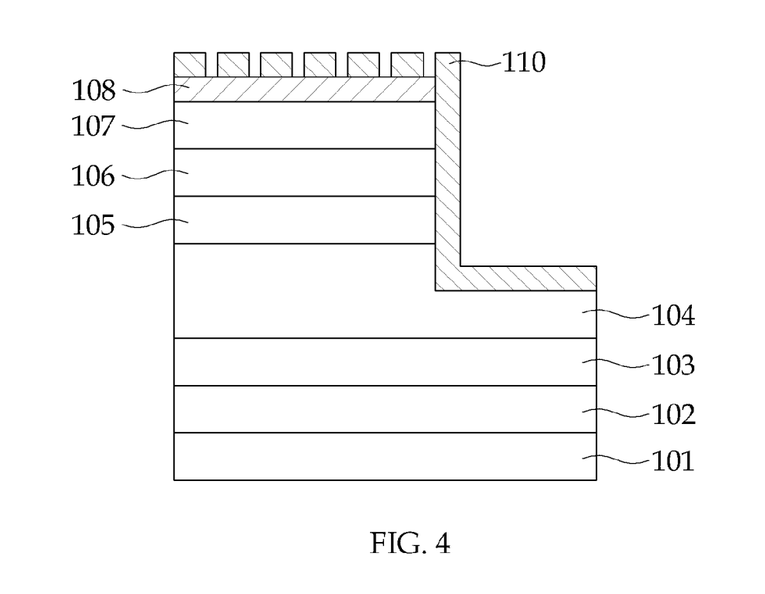

FIG. 4 illustrates a cross-sectional structure of the light emitting device on which the pattern forming layer defining the micro light emitting regions is formed.

The method of manufacturing the light emitting device sequentially laminates the pattern forming layer 110 that is a silicon nitride (SiNx) layer on the first transparent contact layer 108 for the heat treatment process. That is, the pattern defining the micro light emitting regions is formed on the light emitting device by depositing the SiNx layer capable of performing high temperature heat treatment for heat treatment of the first transparent contact layer 108 that is the transparent conducting oxide (IZO) and pattern formation. The method of manufacturing the light emitting device performs an operation of forming a device pattern classifying the light emitting regions by using the deposited SiNx layer. When a horizontal type light emitting device is manufactured, the micro light emitting region is formed on the p-type contact layer 107. The pattern forming layer 110 is formed of silicon nitride (SiNx).

Figure 5:
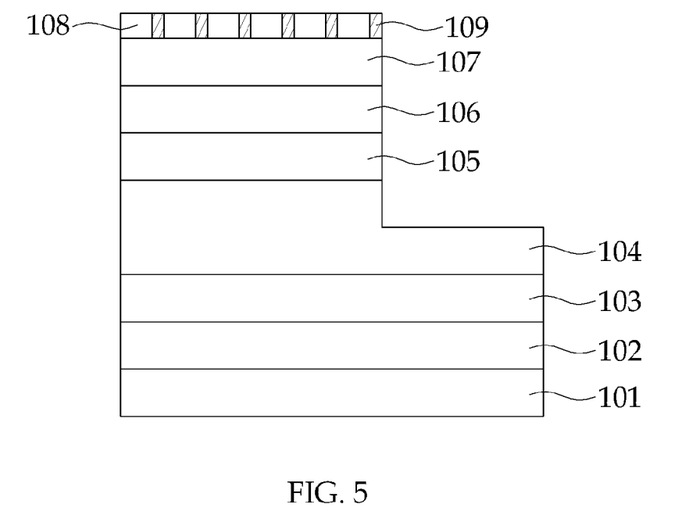

FIG. 5 illustrates a cross-sectional structure of a light emitting device, from which the pattern forming layer used for pattern formation and heat treatment is removed.

The method of manufacturing the light emitting device performs heat treatment of the first transparent contact layer 108 in the structure of the light emitting device of FIG. 4. The heat treatment in an oxygen atmosphere is performed in order to increase resistance of the first transparent contact layer 108. The method of manufacturing the light emitting device removes the SiNx layer used for pattern formation and heat treatment after the transparent resistor layer 109 is formed through the heat treatment. The method of manufacturing the light emitting device divides the fine light emitting region by using the first transparent contact layer using a resistance change property in heat treatment of a material of the transparent conducting oxide used as the first transparent contact layer 108.

Herein, the heat treatment process of the first transparent contact layer 108 may be performed in an oxygen ($O_2$) atmosphere, a heat treatment temperature be 300 to 600° C., and a heat treatment time be in the range of 1 to 60 min Resistance of the first transparent contact layer 108 of the region that does not allow a current to flow therethrough may be minimum $10^3$ Ω/square or more when the micro light emitting region is formed. The heat treatment process uses a change in resistance value of transparent conducting oxide by the heat treatment process in order to form the micro light emitting region. That is, the fine pattern formation and high temperature heat treatment process are used to form the micro light emitting region, and the SiNx (silicon nitride) thin film is used to perform selective etching.

Herein, the size of the micro light emitting region may be 1 to 100 μm. The size of the first transparent contact layer 108 that does not allow a current to flow therethrough may be 1 to 10 μm.

Figure 6:
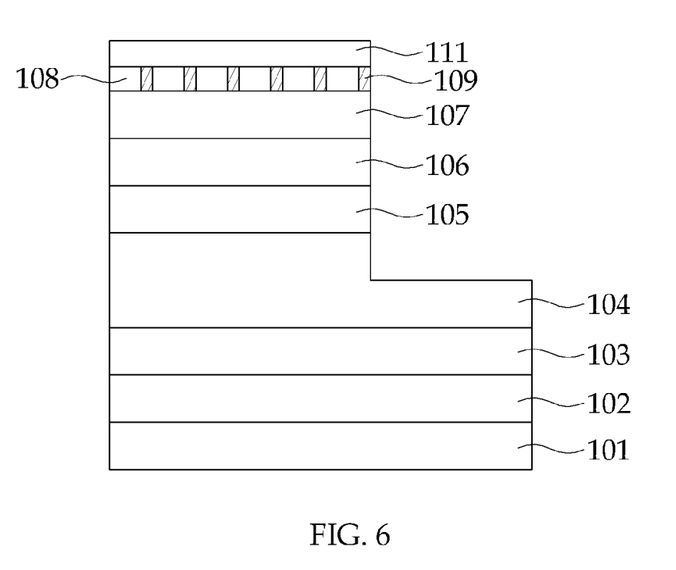

FIG. 6 illustrates a cross-sectional structure of the light emitting device on which the second transparent contact layer is formed.

The method of manufacturing the light emitting device deposits the second transparent contact layer 111 for connecting the light emitting regions classified by the transparent resistor layer 109 on the structure of FIG. 5. That is, the method of manufacturing the light emitting device manufactures an array type of a micro light emitting device by using the second transparent contact layer 111 to connect the micro light emitting regions.

Herein, the second transparent contact layer 111 may be formed of ITO (indium tin oxide), IZO, or ZnO-based transparent conducting oxide. Second transparent contact layer 111 is suitable for a large-area light emitting device having a uniform current distribution property by connecting the light emitting regions divided by the transparent resistor layer 109.

Figure 7:
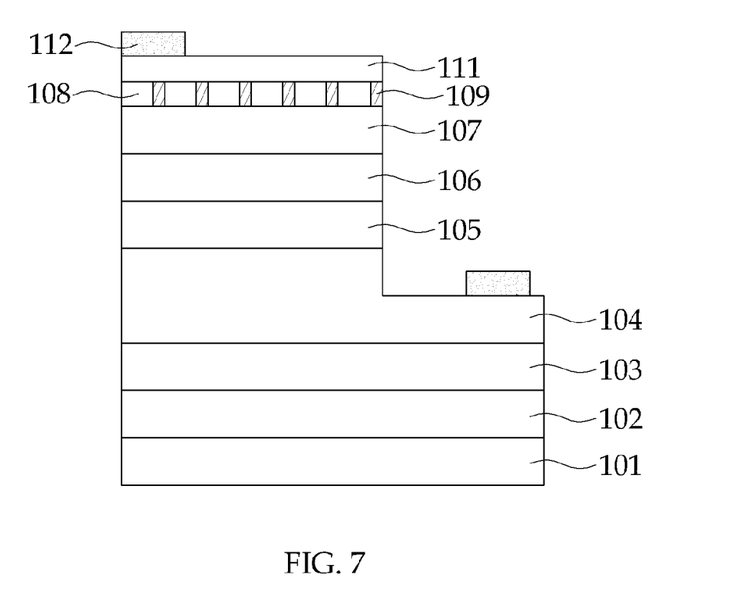

FIG. 7 illustrates a cross-sectional structure of a light emitting device where the n-type/p-type metal contact layer 112 is deposited on the structure of FIG. 6.

As illustrated in FIG. 7, n-/p-type metal contact layer 112 is laminated on the second transparent contact layer 111. That is, the n-type and p-type metal contact layers 112 are sequentially deposited after the second transparent contact layer 111 is deposited.

Accordingly, the method of manufacturing the microarray type nitride light emitting device according to the present disclosure manufactures the microarray type light emitting device through classification of the fine light emitting regions to manufacture the large-area light emitting device. The method of manufacturing the light emitting device forms the first transparent contact layer 108 for classification of the light emitting regions and the current distribution, and divides the fine light emitting region through heat treatment of the first transparent contact layer 108 through pattern formation. The method of manufacturing the light emitting device forms the second transparent contact layer 111 to connect the divided light emitting regions. That is, the method of manufacturing the light emitting device includes processes of dividing the light emitting region by using heat treatment of the first transparent contact layer 108 that is the transparent conducting oxide to implement the microarray type large-area light emitting device, and forming the second transparent contact layer 111 connecting the divided light emitting regions.

Thereby, the method of manufacturing the light emitting device can improve efficiency of a large-area light emitting diode and increase power thereof by forming the fine light emitting regions having the uniform current distribution and connecting the fine light emitting regions as compared to a know method of manufacturing a light emitting device.

Figure 8:
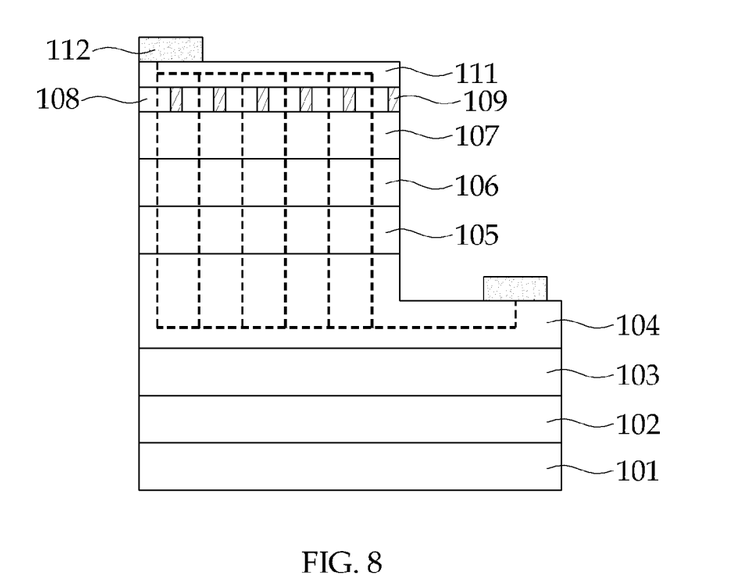
FIG. 8 is an exemplified view of an exemplary embodiment of a current movement of a light emitting region in a light emitting diode according to the present disclosure.

FIG. 8 is an exemplified view of an exemplary embodiment of a current movement of a light emitting region in a light emitting diode according to the present disclosure.

As illustrated in FIG. 8, a current in a light emitting diode as an example of the light emitting device flows through the n-type and p-type metal contact layers 112 as starting points. Herein, a current flow of the light emitting device from the second transparent contact layer 111 through the first transparent contact layer 108 classified by the transparent resistor layer 109 is shown.

Figure 9:
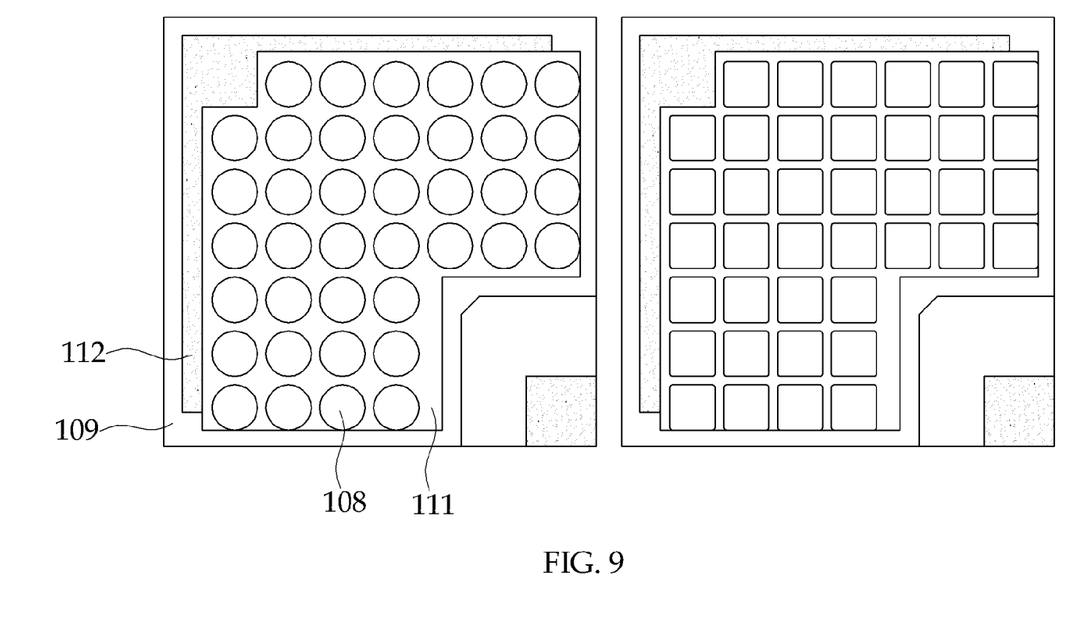
FIG. 9 is a plan view of an exemplary embodiment of a microarray type light emitting diode according to the present disclosure.

FIG. 9 is a plan view of an exemplary embodiment of a microarray type light emitting diode according to the present disclosure.

As illustrated in FIG. 9, the microarray type light emitting diode includes the first transparent contact layer 108, the transparent resistor layer 109, the second transparent contact layer 111, and the n-/p-type metal contact layer 112. The first transparent contact layer 108 classified into the light emitting regions, as illustrated in FIG. 9, may be formed to have various shapes such as a circle or a quadrangle. The first transparent contact layer 108, the transparent resistor layer 109, the second transparent contact layer 111, and the n-/p-type metal contact layer 112 are formed as micro light emitting regions on the p-type contact layer 107 when the horizontal type light emitting device is manufactured.

Figure 10:
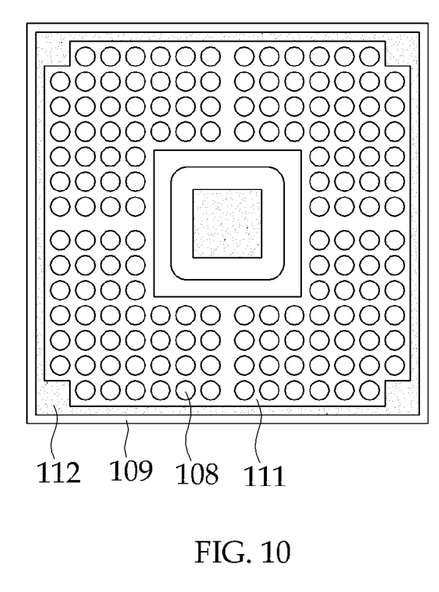
FIG. 10 is a plan view of an exemplary embodiment of a large-area microarray type light emitting diode according to the present disclosure.

FIG. 10 is a plan view of an exemplary embodiment of a large-area microarray type light emitting diode according to the present disclosure.

FIG. 10 illustrates a plane structure to the large-area microarray type light emitting diode manufactured by using the basic structure of the micro light emitting diode of FIG. 9. The large-area microarray type light emitting diode includes the first transparent contact layer 108, the transparent resistor layer 109, the second transparent contact layer 111, and the n-/p-type metal contact layer 112.

Figure 11:
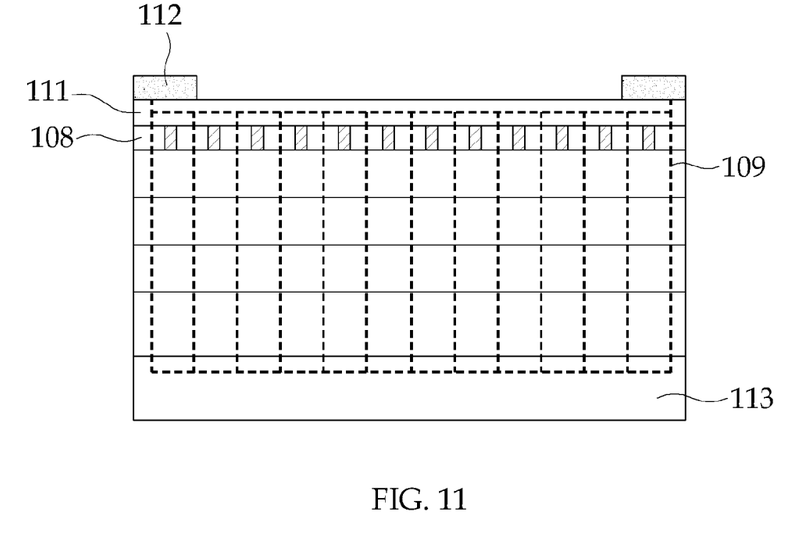
FIG. 11 is an exemplified view of an exemplary embodiment of a current movement of a light emitting region of a vertical type light emitting device according to the present disclosure.

FIG. 11 is an exemplified view of an exemplary embodiment of a current movement of a light emitting region of a vertical type light emitting device according to the present disclosure.

FIG. 11 illustrates a current flow in the light emitting diode when the vertical type microarray light emitting diode is manufactured. As illustrated in FIG. 11, the vertical type microarray light emitting diode includes a p-type metal contact layer and a reflection layer 113 of the vertical type light emitting diode. In the vertical type light emitting diode, a current flow of the light emitting diode from the second transparent contact layer 111 through the first transparent contact layer 108 classified by the transparent resistor layer 109 and through the p-type metal contact layer and the reflection layer 113 is shown.

Figure 12:
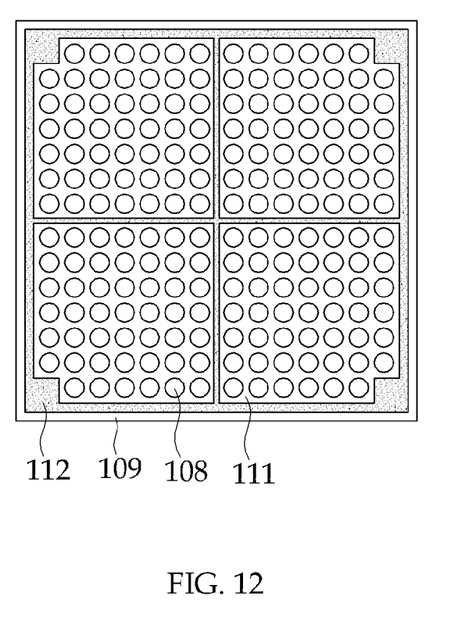
FIG. 12 is a plan view of an exemplary embodiment of the vertical type microarray type light emitting diode according to the present disclosure.

FIG. 12 is a plan view of an exemplary embodiment of the vertical type microarray light emitting diode according to the present disclosure.

FIG. 12 illustrates a plane structure of the vertical type microarray light emitting diode. The method of manufacturing the vertical type light emitting device forms the micro light emitting region on the n-type contact layer or u-GaN layer.

According to the exemplary embodiments of the present disclosure, a uniform current distribution property is ensured by dividing a fine light emitting region by using a first transparent electrode layer according to a resistance change property by heat treatment of a material of a transparent conducting oxide used as a transparent electrode layer, and connecting the divided light emitting regions by using a second transparent electrode layer. At this point, since the present disclosure that is beyond the limit of the known art does not just utilize the related art but commercial or business possibility of applied equipment is sufficient and can be clearly implemented in practice, the present disclosure has industrial applicability.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A microarray-type nitride light emitting device, comprising:
    a substrate;
    a light emitting semiconductor layer comprised of a buffer layer, an n-type nitride contact layer, an active layer, and a p-type nitride contact layer arranged sequentially on the substrate and having a plane though which light is emitted; and
    a multilayered transparent contact layer to divide the plane of the light emitting semiconductor layer into a plurality of microarray-type light emitting regions and a plurality of connect-divided light emitting regions, the multilayered transparent contact layer including:
        a first transparent contact layer that is comprised of a material having a resistance value which is heat determinable, that has a resistance, and that is patterned so as to divide the plane of the light emitting semiconductor layer into the plurality of microarray-type light emitting regions;
        a transparent resistor layer that is defined within the first transparent contact layer, that is comprised of said material having a resistance value which is heat determinable and has a resistance that is higher than that of the first transparent contact layer, and that is effective to limit current flow to respective ones of the plurality of microarray-type light emitting regions so that the plurality of microarray-type light emitting regions are distinguished from each other, respectively; and
        a second transparent contact layer to connect the plurality of microarray-type light emitting regions,
    wherein the plurality of microarray-type light emitting regions are formed by laminating a pattern forming layer on the first transparent contact layer and by performing heat treatment of the first transparent contact layer.

2. The microarray-type nitride light emitting device according to claim 1, wherein said material whose resistance value is heat determinable is a transparent conductive oxide that is IZO (indium zinc oxide)-based or ZnO (zinc oxide)-based.

3. The microarray-type nitride light emitting device of claim 1, wherein the first transparent contact layer has a thickness ranging from 10 to 100 nm.

4. The microarray-type nitride light emitting device of claim 1, wherein the transparent resistor layer has a resistance of $10^3 \Omega$/square or more.

5. The microarray-type nitride light emitting device of claim 4, wherein the transparent resistor layer has a size ranging from 1 to 100 μm.

6. The microarray-type nitride light emitting device of claim 1, wherein the second transparent contact layer is comprised of a transparent conductive oxide that is ITO (indium tin oxide)-based, IZO (indium zinc oxide)-based, or ZnO-based.

7. The microarray-type nitride light emitting device of claim 1, wherein the plurality of microarray-type light emitting regions each have a size ranging from 1 to 100 μm.

8. The microarray-type nitride light emitting device of claim 1, wherein the microarray-type nitride light emitting device is a vertical-type light emitting device, and the plurality of microarray-type light emitting regions are formed on an n-type contact layer or an u-GaN layer.

* * * * *